United States Patent
Wu

(10) Patent No.: US 7,839,186 B2
(45) Date of Patent: Nov. 23, 2010

(54) PRESET CIRCUIT OF AUDIO POWER AMPLIFIER

(75) Inventor: Kuo-Hung Wu, Sinshih Township, Tainan County (TW)

(73) Assignee: Himax Analogic, Inc., Sinshih Township, Tainan County (TW)

(*) Notice: Subject to any disclaimer, the term of this patent is extended or adjusted under 35 U.S.C. 154(b) by 309 days.

(21) Appl. No.: 12/055,646

(22) Filed: Mar. 26, 2008

(65) Prior Publication Data

US 2009/0201056 A1 Aug. 13, 2009

(30) Foreign Application Priority Data

Feb. 12, 2008 (TW) .............................. 97104845 A

(51) Int. Cl.
*H03B 1/00* (2006.01)
(52) U.S. Cl. ...................... 327/112; 327/318; 327/321; 327/328
(58) Field of Classification Search ........................ None
See application file for complete search history.

(56) References Cited

U.S. PATENT DOCUMENTS

| 4,501,978 | A | * | 2/1985 | Gentile et al. | ................. | 326/71 |
| 6,078,206 | A | * | 6/2000 | Watarai | ...................... | 327/320 |
| 6,784,720 | B2 | * | 8/2004 | Miyashita et al. | ........... | 327/322 |

* cited by examiner

*Primary Examiner*—Long Nguyen
(74) *Attorney, Agent, or Firm*—Thomas, Kayden, Horstemeyer & Risley, LLP

(57) ABSTRACT

A preset circuit of an audio power amplifier includes an inverter and a voltage drop device. The inverter receives an input signal to output an output signal, and includes a first switch and a second switch. The first switch is controlled with the input signal, and has a first terminal coupled to a power voltage and a second terminal for outputting the output signal. The second switch is controlled with the input signal, and has a third terminal for outputting the output signal and a fourth terminal coupled to a low reference voltage. The voltage drop device is coupled between the first terminal of the first switch and the power voltage and configured to lower the power voltage. The output signal is kept at a low level when the voltage drop device and the first switch are de-actuated due to the power voltage having a level below a first threshold.

19 Claims, 2 Drawing Sheets

US 7,839,186 B2

PRESET CIRCUIT OF AUDIO POWER AMPLIFIER

RELATED APPLICATIONS

This application claims priority to Taiwan Application Serial Number 97104845, filed Feb. 12, 2008, which is herein incorporated by reference.

BACKGROUND

1. Field of Invention

The present invention relates to a power amplifier. More particularly, the present invention relates to an audio power amplifier.

2. Description of Related Art

An audio system generally consists of three parts. The first part is an audio source, such as a tape player, a disc player or an RF tuner, for retrieving audio information and converting it into an electrical signal. The second part of the audio system is a loudspeaker. The loudspeaker converts electrical signals into acoustic waves to be perceived by a listener. The third part of the audio system is a power amplifier. The power amplifier amplifies the electrical signal from the audio source and supplies the necessary current to drive the loudspeaker.

Since the audio power amplifier is provided to amplify the audio signal from the audio source and supply the necessary current to drive the loudspeaker, it plays an important role in the audio system. However, when a power voltage, which is used for powering the audio power amplifier, increases gradually from 0 to a predetermined value, a preset circuit, which is used for enabling control circuits of the audio power amplifier, is typically unstable at the beginning and cannot output stable signals to enable the control circuits, such that the control circuits are malfunctioned and the audio power amplifier cannot be operated normally as well.

SUMMARY

In accordance with one embodiment of the present invention, a preset circuit of an audio power amplifier is provided. The preset circuit includes an inverter and a voltage drop device. The inverter receives an input signal to output an output signal, and includes a first switch and a second switch. The first switch is controlled with the input signal, and has a first terminal coupled to a power voltage and a second terminal for outputting the output signal. The second switch is controlled with the input signal, and has a third terminal for outputting the output signal and a fourth terminal coupled to a low reference voltage. The voltage drop device is coupled between the first terminal of the first switch and the power voltage and configured to lower the power voltage. The output signal is kept at a low level when the voltage drop device and the first switch are de-actuated due to the power voltage having a level below a first threshold.

In accordance with another embodiment of the present invention, a preset circuit of an audio power amplifier is provided. The preset circuit includes a first switch, a second switch and a diode. The first switch is controlled with an input signal, and has a first terminal coupled to a power voltage and a second terminal for outputting an output signal. The second switch is controlled with the input signal, and has a third terminal for outputting the output signal and a fourth terminal coupled to a low reference voltage. The diode is coupled between the first terminal of the first switch and the power voltage.

For the foregoing embodiments of the present invention, the preset circuit can be provided to stabilize the control circuits of the audio power amplifier when the power voltage starts to increase from 0 to a predetermined value, such that the control circuits can function without problems and the audio power amplifier can be normally operated.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DESCRIPTION OF THE PREFERRED EMBODIMENTS

Figure 1:
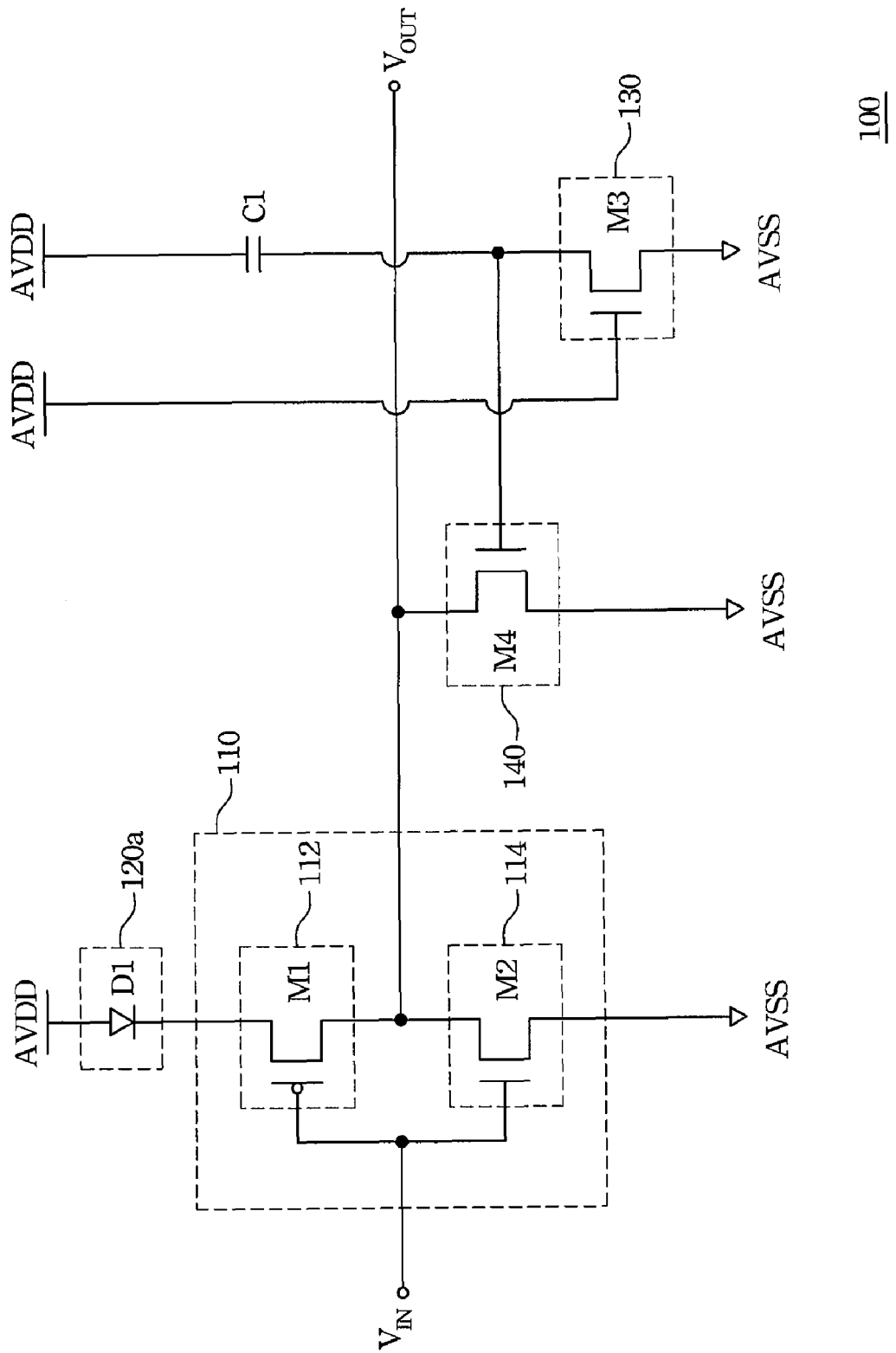
FIG. 1 shows a preset circuit of an audio power amplifier according to one embodiment of the present invention.

FIG. 1 shows a preset circuit of an audio power amplifier according to one embodiment of the present invention. The preset circuit 100 includes an inverter 110 and a voltage drop device 120a. The inverter 110 receives an input signal $V_{IN}$ to output an output signal $V_{OUT}$, and includes a first switch 112 and a second switch 114. The first switch 112 is controlled with the input signal $V_{IN}$, and has a first terminal coupled to a power voltage AVDD through the voltage drop device 120a and a second terminal for outputting the output signal $V_{OUT}$. The second switch 114 is controlled with the input signal $V_{IN}$, and has a third terminal for outputting the output signal $V_{OUT}$ and a fourth terminal coupled to a low reference voltage AVSS. The voltage drop device 120a is coupled between the first terminal of the first switch 112 and the power voltage AVDD, and is configured to lower the power voltage AVDD.

The preset circuit 100 further includes a third switch 130, a fourth switch 140 and a capacitor C1. The third switch 130 is controlled with the power voltage AVDD and has a fifth terminal and a sixth terminal, in which the fifth terminal is coupled to an end of the capacitor C1 and the sixth terminal is coupled to the low reference voltage AVSS. The fourth switch 140 is controlled with the voltage of the fifth terminal of the third switch 130, and has a seventh terminal and an eighth terminal, in which the seventh terminal is coupled to the second terminal of the first switch 112 and the third terminal of the second switch 114, and the eighth terminal is coupled to the low reference voltage AVSS.

In the present embodiment, the first switch 112 is a p-type metal-oxide-semiconductor field effect transistor (MOSFET) M1, and the second switch 114, the third switch 130 and the fourth switch 140 are all n-type MOSFETs, i.e. M2, M3 and M4, respectively. In addition, the voltage drop device 120a is a diode D1. The transistor M1 has a gate controlled with the input signal $V_{IN}$, a source coupled to the cathode of the diode D1, and a drain for outputting the output signal $V_{OUT}$. The transistor M2 has a gate controlled with the input signal $V_{IN}$, a drain for outputting the output signal $V_{OUT}$, and a source coupled to the low reference voltage AVSS. The anode of the diode D1 is coupled to the power voltage AVDD. The transistor M3 has a gate controlled with the power voltage AVDD, a drain coupled to the capacitor C1, and a source coupled to the low reference voltage AVSS. The transistor M4 has a gate controlled with the voltage of the drain of the transistor M3, a drain coupled to the drains of the transistors M1 and M2, and a source coupled to the low reference voltage AVSS.

During operation, when the power voltage AVDD starts to increase gradually from 0 to a level below a first threshold, e.g. 0.7 V, such that the diode D1 and the transistor M1 are de-actuated, the output signal $V_{OUT}$ is kept at a low level. When the power voltage AVDD increases to a level above the first threshold but below a second threshold, e.g. 0.7~1.0 V, such that the diode D1 and the transistor M3 are actuated accordingly and the transistor M1 is still de-actuated, the capacitor C1 charges to actuate the transistor M4, and the output signal $V_{OUT}$ is thus kept at the low level as well. After that, when the power voltage AVDD increases to a third threshold, e.g. 1.4 V, such that the diode D1 and the transistor M1 both are actuated, the output signal $V_{OUT}$ is transferred from the input signal $V_{IN}$ in accordance with the inverter 110, i.e. the transistors M1 and M2. Therefore, the output signal $V_{OUT}$ can be kept at the low level at the beginning when the power voltage AVDD starts to increase.

Figure 2:
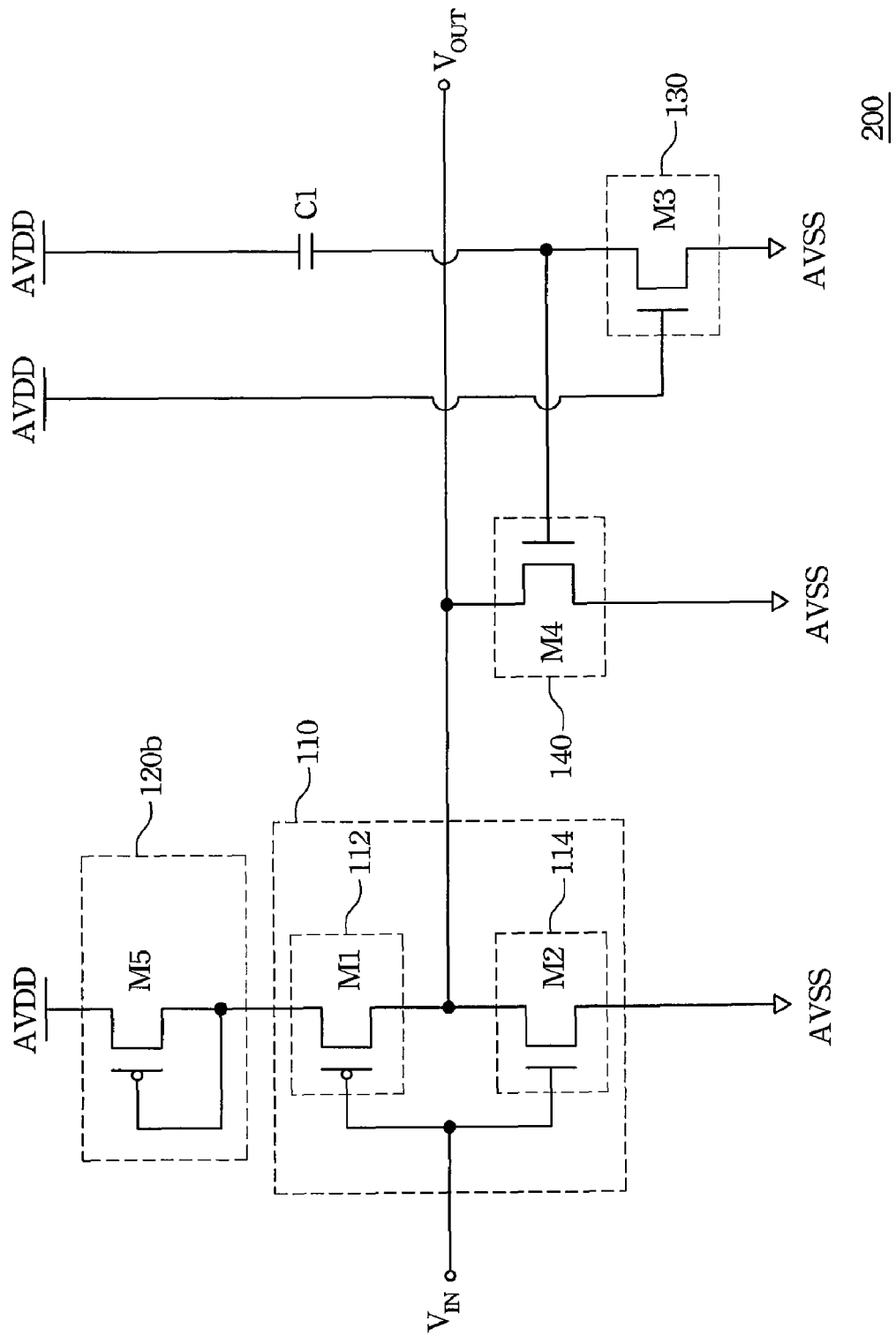
FIG. 2 shows a preset circuit of an audio power amplifier according to another embodiment of the present invention.

FIG. 2 shows a preset circuit of an audio power amplifier according to another embodiment of the present invention. Compared to FIG. 1, the voltage drop device 120b of the preset circuit 200 is a p-type MOSFET M5. The transistor M5 has a gate and a drain both coupled to the source of the transistor M1 and a source coupled to the power voltage AVDD.

Similarly, during operation, when the power voltage AVDD starts to increase gradually from 0 to a level below the first threshold, e.g. 0.7 V, such that the transistor M5 and the transistor M1 are de-actuated, the output signal $V_{OUT}$ is kept at the low level. When the power voltage AVDD increases to a level above the first threshold but below the second threshold, e.g. 0.7-1.0 V, such that the transistor M5 and the transistor M3 are actuated accordingly and the transistor M1 is still de-actuated, the capacitor C1 charges to actuate the transistor M4, and the output signal $V_{OUT}$ is thus kept at the low level as well. After that, when the power voltage AVDD increases to the third threshold, e.g. 1.4 V, such that the transistor M5 and the transistor M1 both are actuated, the output signal $V_{OUT}$ is transferred from the input signal $V_{IN}$ in accordance with the inverter 110, i.e. the transistors M1 and M2. Therefore, the output signal $V_{OUT}$ also can be kept at the low level at the beginning when the power voltage AVDD starts to increase.

For the foregoing embodiments of the present invention, the preset circuit can be provided to stabilize the control circuits of the audio power amplifier when the power voltage starts to increase from 0 to a predetermined value, such that the control circuits can function without problems and the audio power amplifier can be normally operated.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A preset circuit of an audio power amplifier, comprising:
an inverter receiving an input signal to output an output signal, the inverter comprising:
a first switch controlled with the input signal and having a first terminal coupled to a power voltage and a second terminal for outputting the output signal; and
a second switch controlled with the input signal and having a third terminal for outputting the output signal and a fourth terminal coupled to a low reference voltage;
a voltage drop device coupled between the first terminal of the first switch and the power voltage and configured to lower the power voltage; and
a third switch controlled by the power voltage and having a fifth terminal and a sixth terminal, wherein the fifth terminal is coupled to the power voltage through a capacitor and the sixth terminal is coupled to the low reference voltage;
wherein the output signal is kept at a low level when the voltage drop device and the first switch are de-actuated due to the power voltage starting to increase gradually from 0 to a level below a first threshold.

2. The preset circuit as claimed in claim 1, further comprising:
a fourth switch controlled by a voltage of the fifth terminal of the third switch and having a seventh terminal and an eighth terminal, wherein the seventh terminal is coupled to the second terminal of the first switch and the third terminal of the second switch, and the eighth terminal is coupled to the low reference voltage.

3. The preset circuit as claimed in claim 2, wherein when the power voltage increases to a second threshold to actuate the third switch, the capacitor charges to actuate the fourth switch, so that the output signal is kept at the low level.

4. The preset circuit as claimed in claim 2, wherein the third switch is an n-type metal-oxide-semiconductor field effect transistor, a gate of which is controlled with the power voltage, a drain of which is the fifth terminal, a source of which is the sixth terminal.

5. The preset circuit as claimed in claim 2, wherein the fourth switch is an n-type metal-oxide-semiconductor field effect transistor, a gate of which is controlled with the voltage of the fifth terminal of the third switch, a drain of which is the seventh terminal, a source of which is the eighth terminal.

6. The preset circuit as claimed in claim 1, wherein when the power voltage increases to a third threshold such that the voltage drop device and the first switch are actuated, the output signal is transferred from the input signal according to the inverter.

7. The preset circuit as claimed in claim 1, wherein the voltage drop device is a diode having an anode coupled to the power voltage and a cathode coupled to the first terminal of the first switch.

8. The preset circuit as claimed in claim 1, wherein the voltage drop device is a p-type metal-oxide-semiconductor field effect transistor having a source coupled to the power voltage and both a gate and a drain coupled to the first terminal of the first switch.

9. The preset circuit as claimed in claim 1, wherein the first switch is a p-type metal-oxide-semiconductor field effect transistor, a gate of which is controlled with the input signal, a source of which is the first terminal, a drain of which is the second terminal.

10. The preset circuit as claimed in claim 1, wherein the second switch is an n-type metal-oxide-semiconductor field effect transistor, a gate of which is controlled with the input signal, a drain of which is the third terminal, a source of which is the fourth terminal.

11. A preset circuit of an audio power amplifier, comprising:
a first switch controlled with an input signal and having a first terminal coupled to a power voltage and a second terminal for outputting an output signal;

a second switch controlled with the input signal and having a third terminal for outputting the output signal and a fourth terminal coupled to a low reference voltage;

a capacitor having a first end coupled to the power voltage;

a third switch controlled by the power voltage and having a fifth terminal and a sixth terminal, the fifth terminal is coupled to a second end of the capacitor and the sixth terminal is coupled to the low reference voltage; and a diode coupled between the first terminal of the first switch and the power voltage.

12. The preset circuit as claimed in claim 11, wherein the output signal is kept at a low level when the diode and the first switch are de-actuated due to the power voltage starting to increase gradually from 0 to a level below a first threshold.

13. The preset circuit as claimed in claim 11, further comprising:

a fourth switch controlled by a voltage of the fifth terminal of the third switch and having a seventh terminal and an eighth terminal, wherein the seventh terminal is coupled to the second terminal of the first switch and the third terminal of the second switch, and the eighth terminal is coupled to the low reference voltage.

14. The preset circuit as claimed in claim 13, wherein when the power voltage increases to a second threshold to actuate the third switch, the capacitor charges to actuate the fourth switch, so that the output signal is kept at the low level.

15. The preset circuit as claimed in claim 13, wherein the third switch is an n-type metal-oxide-semiconductor field effect transistor, a gate of which is controlled with the power voltage, a drain of which is the fifth terminal, a source of which is the sixth terminal.

16. The preset circuit as claimed in claim 13, wherein the fourth switch is an n-type metal-oxide-semiconductor field effect transistor, a gate of which is controlled with the voltage of the fifth terminal of the third switch, a drain of which is the seventh terminal, a source of which is the eighth terminal.

17. The preset circuit as claimed in claim 11, wherein when the power voltage increases to a third threshold such that the diode and the first switch are actuated, the output signal is transferred from the input signal according to the first switch and the second switch.

18. The preset circuit as claimed in claim 11, wherein the first switch is a p-type metal-oxide-semiconductor field effect transistor, a gate of which is controlled with the input signal, a source of which is the first terminal, a drain of which is the second terminal.

19. The preset circuit as claimed in claim 11, wherein the second switch is an n-type metal-oxide-semiconductor field effect transistor, a gate of which is controlled with the input signal, a drain of which is the third terminal, a source of which is the fourth terminal.

* * * * *